(12) United States Patent
Lee

(10) Patent No.: US 11,552,124 B2
(45) Date of Patent: Jan. 10, 2023

(54) MANUFACTURING METHOD OF DISPLAY APPARATUS

(71) Applicant: Innolux Corporation, Chu-Nan (TW)

(72) Inventor: Kuan-Feng Lee, Miao-Li County (TW)

(73) Assignee: INNOLUX CORPORATION, Chu-Nan (TW)

( * ) Notice: Subject to any disclaimer, the term of this patent is extended or adjusted under 35 U.S.C. 154(b) by 411 days.

(21) Appl. No.: 16/670,589

(22) Filed: Oct. 31, 2019

(65) Prior Publication Data

US 2020/0066788 A1 Feb. 27, 2020

Related U.S. Application Data

(63) Continuation of application No. 15/481,567, filed on Apr. 7, 2017, now abandoned.

(30) Foreign Application Priority Data

Apr. 14, 2016 (CN) .......................... 201610230262.6

(51) Int. Cl.
| | |
|---|---|
| H01L 27/15 | (2006.01) |
| H01L 25/16 | (2006.01) |
| H01L 27/32 | (2006.01) |
| H01L 33/52 | (2010.01) |
| H01L 25/04 | (2014.01) |
| H01L 25/075 | (2006.01) |

(52) U.S. Cl.
CPC .......... *H01L 27/156* (2013.01); *H01L 25/167* (2013.01); *H01L 27/3253* (2013.01); *H01L 33/52* (2013.01); *H01L 25/048* (2013.01); *H01L 25/0753* (2013.01); *H01L 2227/323* (2013.01); *H01L 2933/005* (2013.01); *H01L 2933/0033* (2013.01)

(58) Field of Classification Search
CPC . H01L 27/156; H01L 25/167; H01L 27/3253; H01L 33/52; H01L 25/048; H01L 25/0753; H01L 2227/323; H01L 2933/0033; H01L 2933/005; H01L 27/3244; H01L 27/3248; H01L 27/3276
See application file for complete search history.

(56) References Cited

U.S. PATENT DOCUMENTS

| 6,040,621 A * | 3/2000 | Nose ................. H01L 23/49541 257/691 |
| 2012/0007101 A1* | 1/2012 | Yang ..................... H01L 33/007 257/76 |
| 2013/0059443 A1* | 3/2013 | Chang ................... H01L 33/647 438/702 |

(Continued)

FOREIGN PATENT DOCUMENTS

WO 2015083823 A1 6/2015

OTHER PUBLICATIONS

Chinese Office Action dated Dec. 23, 2019.

*Primary Examiner* — Benjamin Tzu-Hung Liu
(74) *Attorney, Agent, or Firm* — Rabin & Berdo, P.C.

(57) ABSTRACT

A display apparatus includes at least one substrate with several penetration holes, several displaying units and several switch devices disposed at different sides of the at least one substrate, and at least one bonding material filling up the penetration holes, wherein the displaying units and the switch devices are connected to each other through the at least one bonding material.

18 Claims, 15 Drawing Sheets

(56) References Cited

U.S. PATENT DOCUMENTS

| | | | |
|---|---|---|---|
| 2014/0004704 A1* | 1/2014 | Hung | H01L 21/0274 438/694 |
| 2014/0042481 A1* | 2/2014 | Inoue | H01L 33/10 257/98 |
| 2015/0181658 A1* | 6/2015 | Logiudice | G09G 3/32 315/294 |
| 2017/0133356 A1* | 5/2017 | Mercier | H01L 33/24 |
| 2017/0309798 A1* | 10/2017 | Bonar | H01L 33/22 |

* cited by examiner

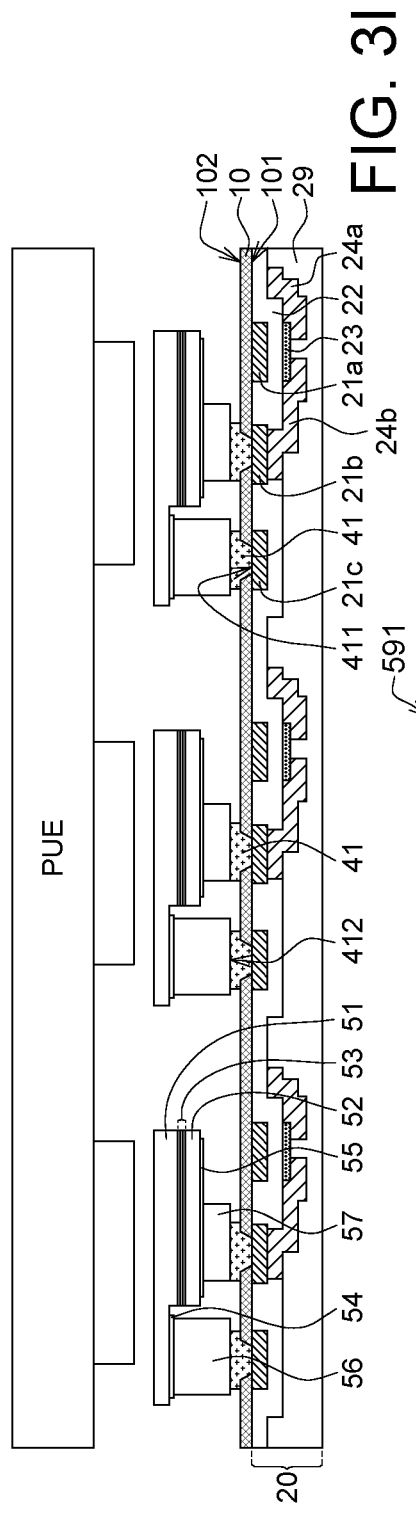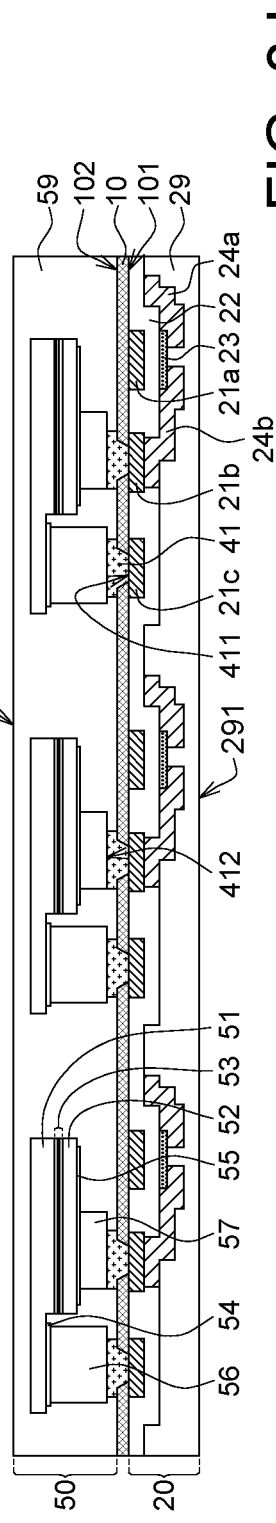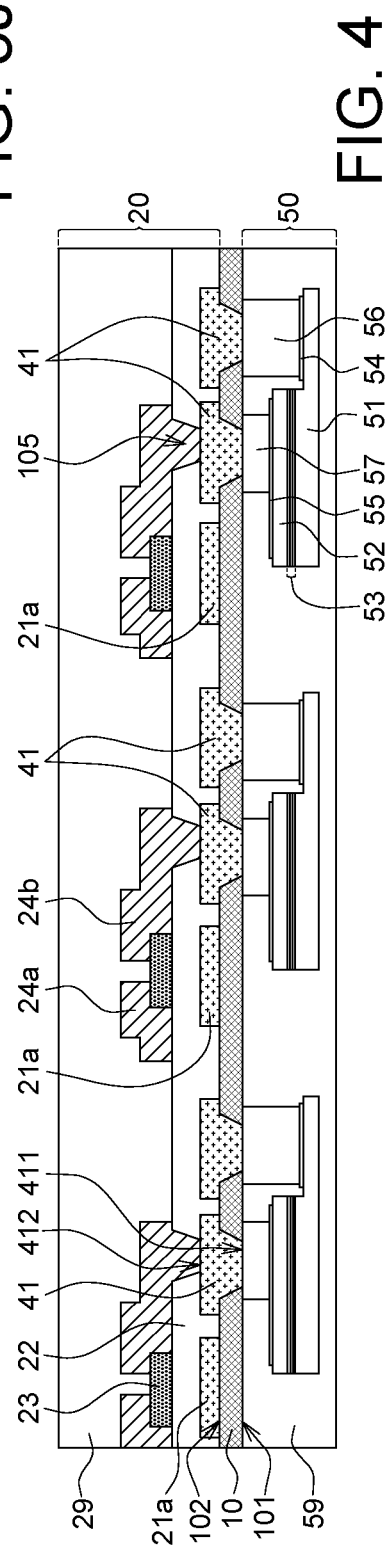

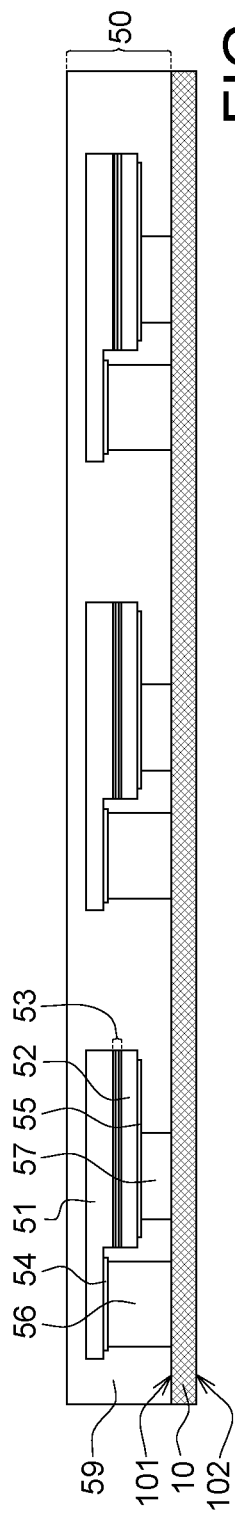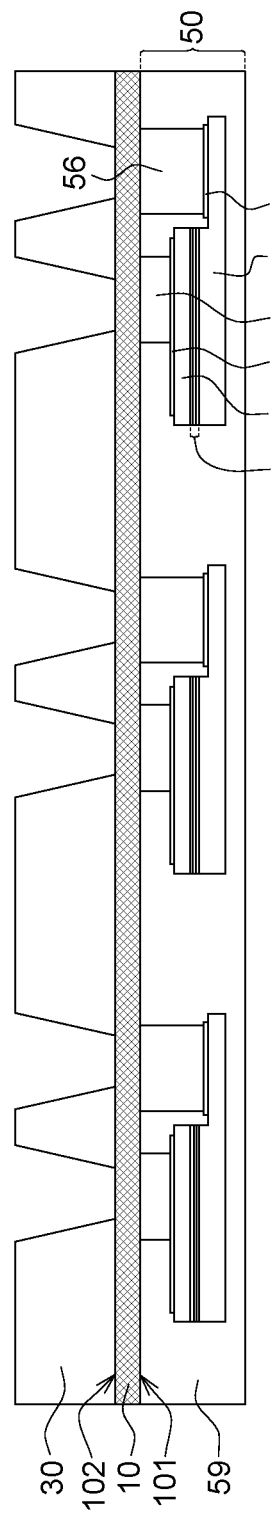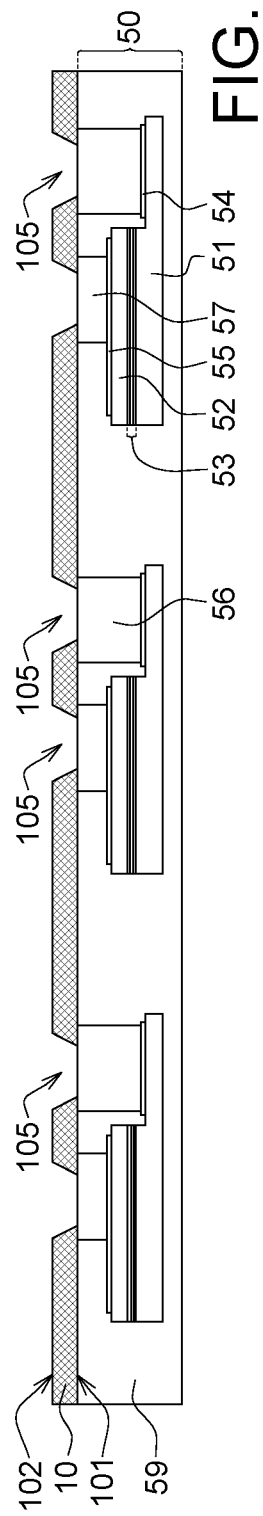

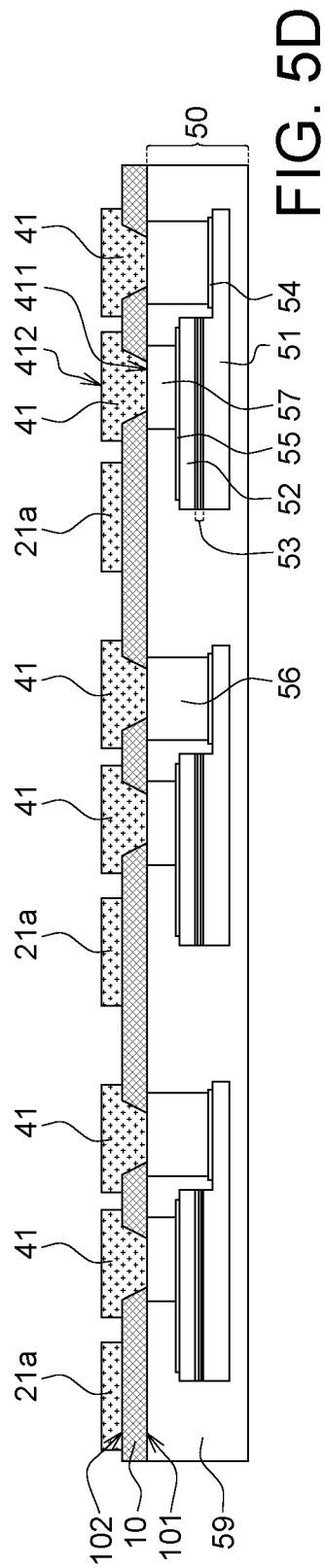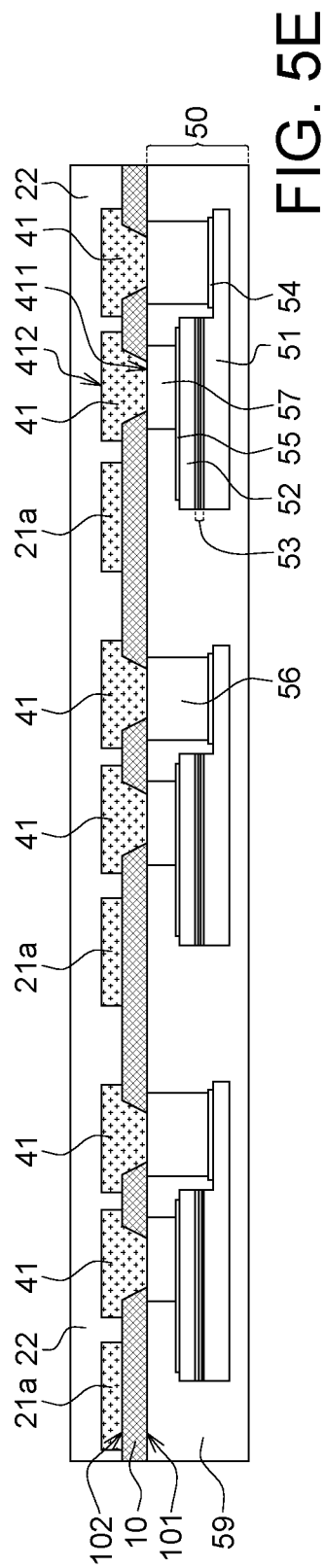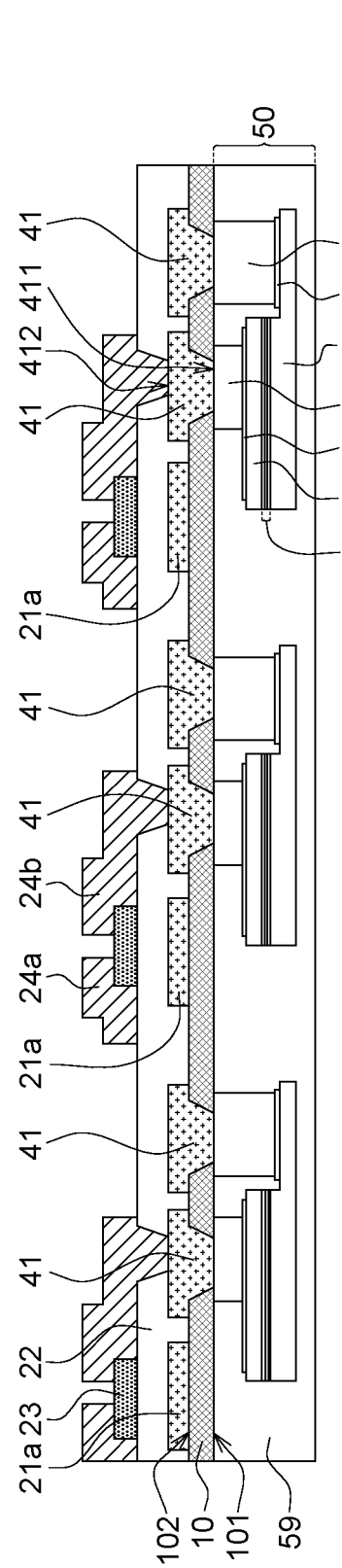

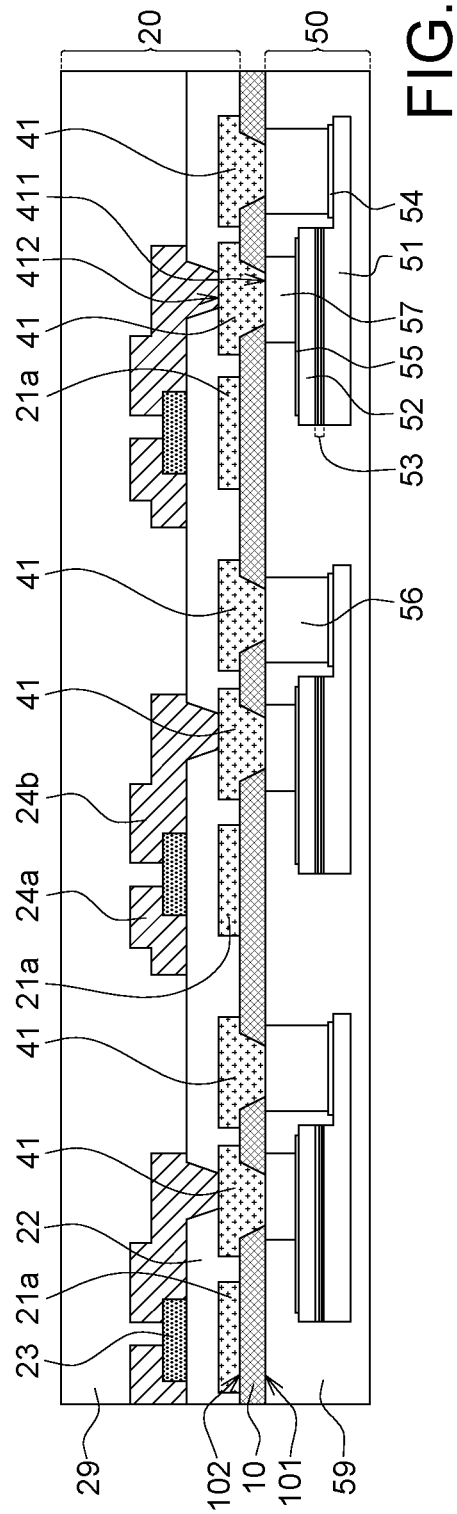
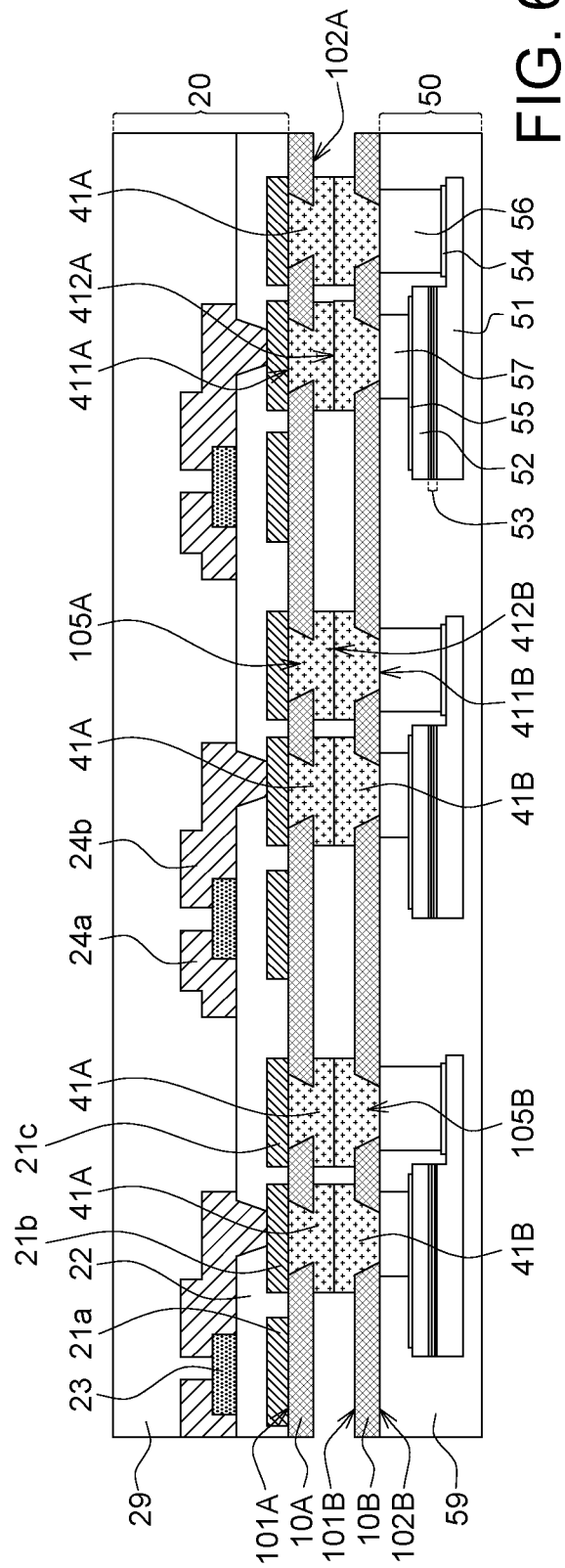

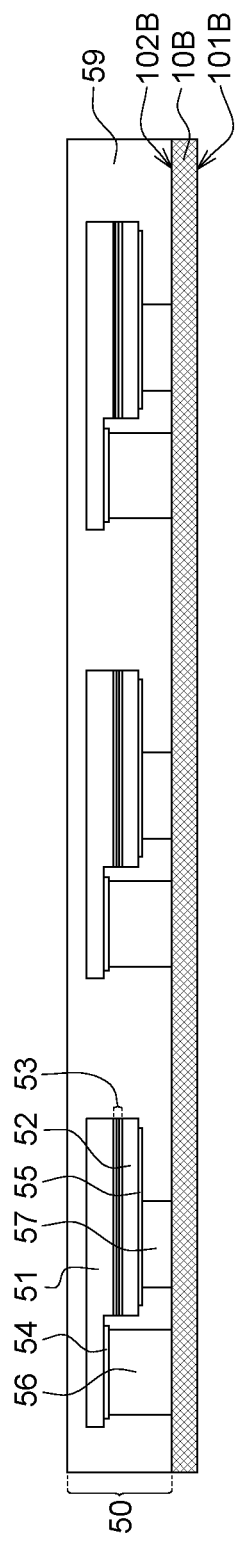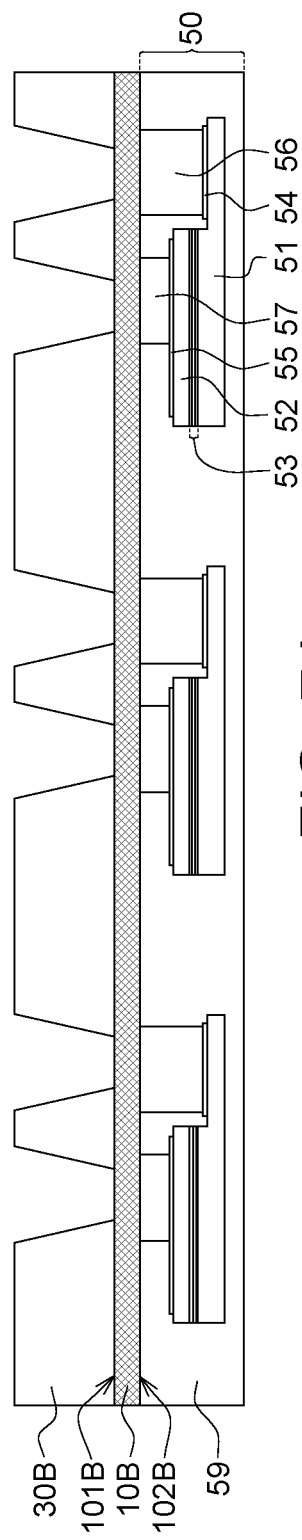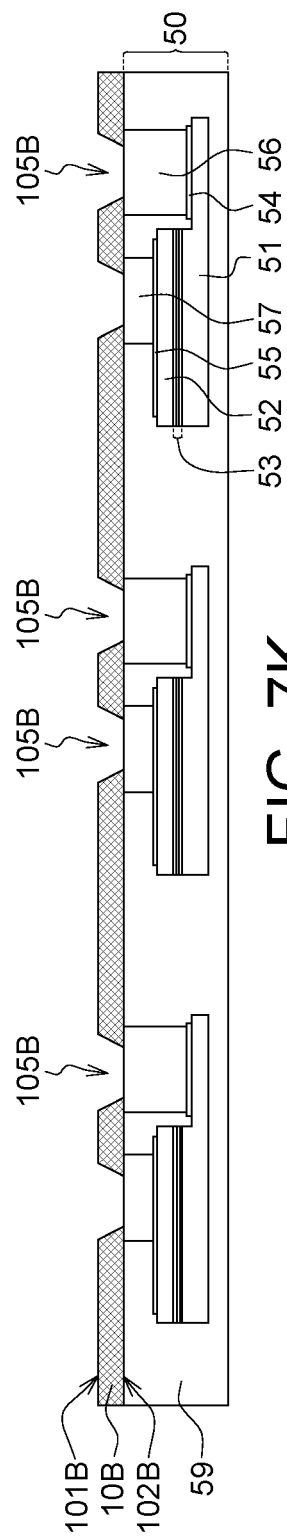

MANUFACTURING METHOD OF DISPLAY APPARATUS

This application is a continuation application of U.S. application Ser. No. 15/481,567, filed Apr. 7, 2017, which claims the benefit of People's Republic of China application Serial No. 201610230262.6, filed Apr. 14, 2016, the subject matters of which are incorporated herein by references.

BACKGROUND

Technical Field

The disclosure relates in general to a display apparatus, and more particularly to a display apparatus with plural displaying units and switch devices disposed at different sides of the substrate.

Description of the Related Art

Electronic products with display panel, such as smart phones, tablets, notebooks, monitors, and TVs, have become indispensable necessities to modern people no matter in their work, study or entertainment. With a flourishing development of the portable electronic products, the consumers have higher expects on the functions, the specifications and the prices of the products. The development of next-generation display focuses on the energy saving and environment-friendly techniques. Different displaying techniques have been well-developed. For example, liquid crystal display (LCD) has several advantages of lightweight, compactness, portability and low price, which has replaced the CRT monitors and becomes one of the most commonly-used displays in the electronic products. Besides LCD displaying technique, the displaying techniques also include the organic light emitting diode (OLED) displaying technique and the micro-LED displaying technique. In the OLED displaying technique, the organic material thin film (ex: an emissive electroluminescent layer) and the glass substrate are adopted. When an electric current passes through the emissive electroluminescent layer, the emissive electroluminescent layer emits light in response to the electric current; thus, no backlight is required in the OLED display. Compared to the LCD, the OLED display without a backlight saves more energy, and is lighter and thinner. However, a life span of an OLED display is shorter than that of a LCD (ex: due to the short life span of the blue organic material). Also, it is more challenging for making a large size OLED display than making a large size LCD display. The micro-LED displaying technique drives an array of addressed micro-LEDs, and possesses several advantages such as power-saving, simple construction, small volume, thin outline package, high brightness, high reliability and high speed of response, etc. Moreover, the stability of materials and the life span of the micro-LED display are better than that of the OLED display. The micro-LED display would be more competitive than the OLED display in the future.

Whether what types of the displaying techniques or related components are adopted in the display apparatus, the important factors for manufacturing a qualified display apparatus includes not only the details in procedures such as accurate patterning steps (ex: lithography and etch) for manufacturing the semiconductive layers and conductive layers without breaking the related traces and patterns, but also the precise positions of the relative layers and pattern designs for meeting the electrical performance requirements of the product, thereby producing the display apparatus with good reliability. For example, whether the electrical connections between the displaying units and the switch devices are good is one of considerable factors for determining the electrical performances of the display apparatus. The faulty design of the display apparatus will lead to the decreases of the yield and reliability of production, thereby affecting the electrical performances of the display apparatus and deteriorating the displaying quality.

SUMMARY

The disclosure is directed to a display apparatus, which the displaying units and the switch devices are respectively disposed at different sides of the substrate, and a bonding material fills up the penetration holes of the substrate for electrical connecting the displaying units and the switch devices, thereby increasing the production yields.

According to one aspect of the present disclosure, a display apparatus is provided, comprising at least one substrate having a plurality of penetration holes; plural displaying units and switch devices respectively disposed at different sides of the at least one substrate; and at least one bonding material filling up the plurality of penetration holes, wherein the displaying units and the switch devices are connected to each other through the at least one bonding material.

According to one aspect of the present disclosure, another display apparatus is provided, comprising a first substrate having plural first penetration holes filled with a first bonding material; a second substrate having plural second penetration holes filled with a second bonding material; plural switch devices disposed at an upper side of the first substrate; and plural displaying units disposed at a lower side of the second substrate, wherein a lower side of the first substrate is assembled to an upper side of the second substrate through connection between the first bonding material and the second bonding material.

According to one aspect of the present disclosure, another display apparatus is provided, comprising at least one substrate having plural penetration holes and data lines intersected with scan lines to define a plurality of pixel regions. Each of the pixel regions comprises a displaying unit and a switch device respectively disposed at different sides of the at least one substrate; and at least one bonding material filling up the penetration holes, wherein the displaying unit is connected to the switch device through the at least one bonding material.

BRIEF DESCRIPTION OF THE DRAWINGS

FIG. 3A-FIG. 3J depict a method of manufacturing the display apparatus of the first embodiment.

FIG. 4 is a cross-sectional view of three adjacent pixel regions of a display apparatus according to the second embodiment of the present disclosure.

FIG. 5A-FIG. 5G show a method of manufacturing the display apparatus of the second embodiment.

FIG. 6 is a cross-sectional view of three adjacent pixel regions of a display apparatus according to the third embodiment of the present disclosure.

FIG. 7A-FIG. 7M show a method of manufacturing the display apparatus of the third embodiment.

DETAILED DESCRIPTION

Figure 1:
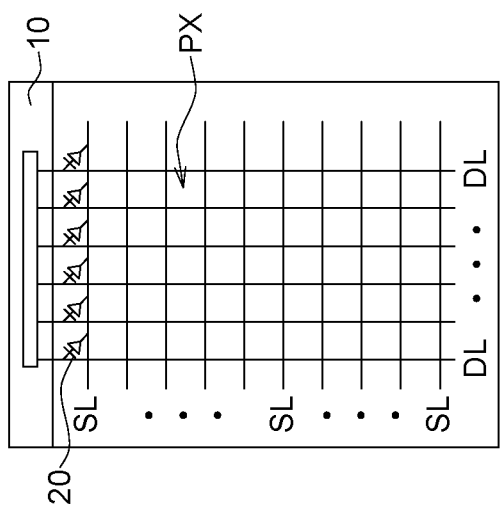
FIG. 1 is a simple top view of a substrate of a display apparatus according to one embodiment of the present disclosure.

In the embodiments of the present disclosure, a display apparatus is provided. According to the embodiment, the displaying units and the switch devices are respectively disposed at different sides of the substrate, and a bonding material fills up the penetration holes of the substrate for electrical connecting the displaying units and the switch devices. According to the design of the embodiments, the accurate patterns of the displaying units and the switch devices can be implemented without sacrificing the electrical performance. Excellent electrical performances of the display apparatus (including good electrical connection) can be achieved, thereby producing the display apparatus with good reliability and good displaying quality. Also, according to the embodied design of the display apparatus, the displaying units directly disposed on the substrate can further increase the production yields.

The embodiments of the present disclosure can be applied to an array substrate of a display apparatus, and the switch devices on the substrate can be (but not limited to) the thin film transistors (TFT). Examples of the applicable types of TFT include the back channel etch type TFT, the etch-stop type TFT, the top-gate type TFT, and the bottom-gate type TFT. The applicable types of lighting devices in the embodiment can be micro-LEDs (light emitting diodes), OLEDs, or other suitable self-emission components.

The embodiments are described in details with reference to the accompanying drawings. It is noted that the details of the structures of the embodiments are provided for exemplification, and the described details of the embodiments are not intended to limit the present disclosure. It is noted that not all embodiments of the invention are shown. Modifications and variations can be made without departing from the spirit of the disclosure to meet the requirements of the practical applications. Thus, there may be other embodiments of the present disclosure which are not specifically illustrated. Further, the accompany drawings are simplified for clear illustrations of the embodiment; sizes and proportions in the drawings are not directly proportional to actual products, and shall not be construed as limitations to the present disclosure. Thus, the specification and the drawings are to be regard as an illustrative sense rather than a restrictive sense. Also, the identical and/or similar elements of the embodiments are designated with the same and/or similar reference numerals.

Moreover, use of ordinal terms such as "first", "second", "third", etc., in the specification and claims to modify an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

First Embodiment

FIG. 1 is a simple top view of a substrate of a display apparatus according to one embodiment of the present disclosure. The substrate of the embodiment can be an array substrate, including several data lines DL and several scan lines SL intersected with each other to define a plurality of pixel regions PX as an array. Each pixel region PX (such as a sub-pixel region) includes at least one switch device, such as a TFT, for independently controlling an affiliated pixel region PX. Also, the displaying unit and the switch device in each of the pixel regions PX are respectively disposed at different sides of the substrate 10, such as respectively at the upper side and the lower side.

Figure 2:
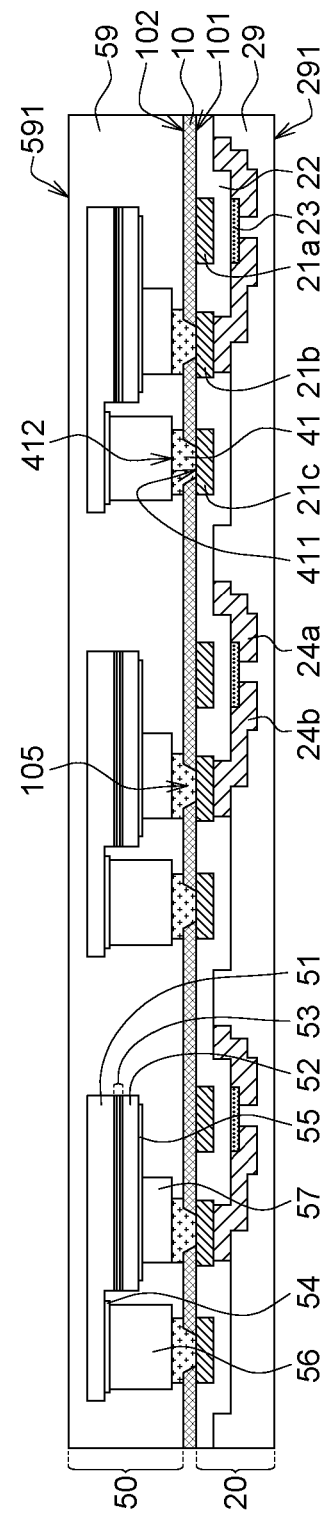
FIG. 2 is a cross-sectional view of three adjacent pixel regions of a display apparatus according to the first embodiment of the present disclosure.

FIG. 2 is a cross-sectional view of three adjacent pixel regions of a display apparatus according to the first embodiment of the present disclosure. In the first embodiment, the back channel etching type (BCE-type) TFTs and the micro-LEDs are exemplified for illustrating the switch devices 20 and the displaying units 50 disposed at different sides of the substrate 10 according to the embodied design. As shown in FIG. 2, the substrate 10 has a first surface 101 and a second surface 102 positioned at different sides (i.e. opposite sides of the substrate 10), wherein the switch devices 20 are disposed at the first surface 101 and the switch devices 50 are disposed at the second surface 102. The substrate 10 has several penetration holes 105, and the bonding material 41 fills up the penetration holes 105. In the embodiment, the bonding material 41 is a conductive material, and the displaying units 50 are electrically connected to the switch devices 20 by the bonding material 41.

In the embodiment, the switch device 20 (i.e. the BCE-type TFT) may include a gate electrode 21a, an anode 21b, a cathode 21c, a gate insulating layer 22 (formed on the gate electrode 21a, the anode 21b and the cathode 21c), a semiconductor layer 23 formed on the gate insulating layer 22, a source electrode 24a/a drain electrode 24b (S/D), and a first protective layer 29 covering those switch elements (i.e. can be referred as a switching assembly). In the first embodiment, the switch electrodes (ex: the anode 21b and the cathode 21c) of the switch device 20 directly contact the substrate 10, and the penetration holes 105 are positioned correspondingly to the switch electrodes.

The displaying units 50 of the embodiment can be implemented by micro-LEDs. Take a GaN (gallium-nitride)-based LED (i.e. a blue light-emitting diode) for example, a GaN-based LED includes a N-type GaN layer 51, a P-type GaN layer 52, a multiple-quantum-well layer (MQW) 53, a N-type conductive layer 54 formed on the N-type GaN layer 51, a P-type conductive layer 55 formed on the P-type GaN layer 52, an N-type bump 56 formed on the N-type conductive layer 54 and a P-type bump 57 formed on the P-type conductive layer 55. Also, the N-type bump 56 and the N-type conductive layer 54 function as a N-type electrode of the displaying unit 50, while the P-type bump 57 and the P-type conductive layer 55 function as a P-type electrode of the displaying unit 50. It is known that those elements as described above are provided for illustrating one type of applicable displaying unit 50. Other light colors and/or configurations of the displaying units are applicable, and the disclosure is not limited thereto.

As shown in FIG. 2, the penetration holes 105 penetrate the substrate 10 from the second surface 102 to the first surface 101 to expose switch electrodes (such as the anode 21b and the cathode 21c) of the switch devices 20. The bonding material 41 filling up the penetration holes 105 has a top surface 411 and a bottom surface 412, wherein the top surface 411 contacts the switch electrodes (such as the anode 21b and the cathode 21c) of the switch devices 20, and the bottom surface 412 contacts the electrode layers (such as the N-type bump 56 and the P-type bump 57) of the displaying units 50.

Figure 3A:
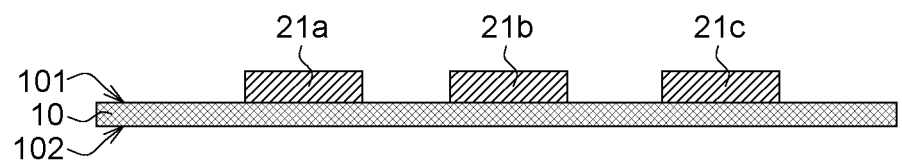
Figure 3B:
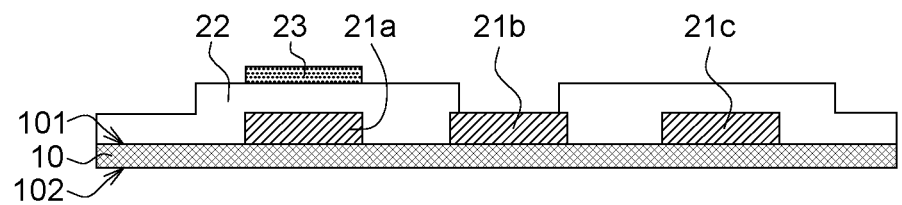
Figure 3C:
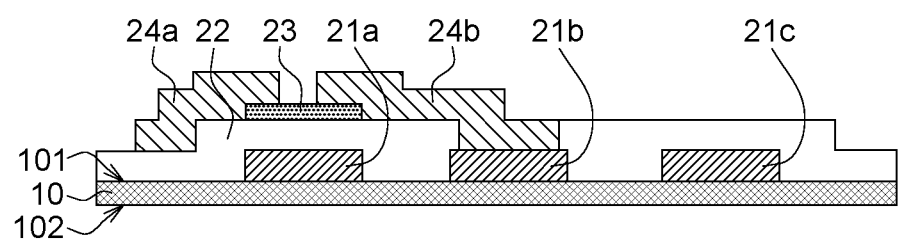
Figure 3D:
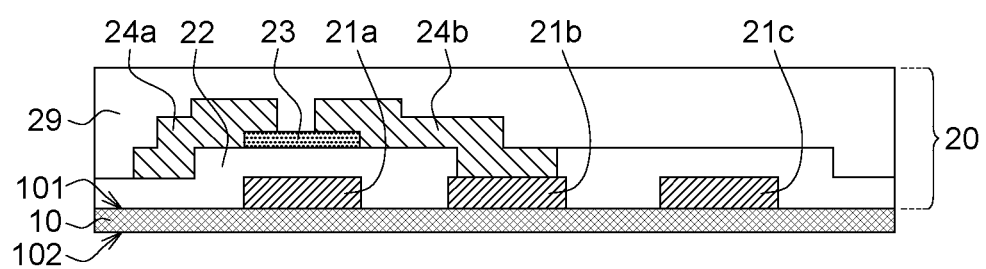

FIG. 3A-FIG. 3J depict a method of manufacturing the display apparatus of the first embodiment. The identical and/or similar elements of FIG. 3A-FIG. 3J and FIG. 2 are designated with the same and/or similar reference numerals for clear illustration. As shown in FIG. 3A, a substrate 10 having the first surface 101 and the second surface 102 positioned at different sides (ex: referred to the upper and lower sides, or the front and back sides) is provided, and a patterned conductive layer is formed on the first surface 101 to form the gate electrode 21a, the anode 21b and the cathode 21c of the switch device. As shown in FIG. 3B, the gate insulating layer 22 is formed on the patterned conductive layer to cover the gate electrode 21a and the cathode 21c but expose the surface of the anode 21b. Also, the semiconductor layer 23 is formed on the gate insulating layer 22 and disposed correspondingly to the gate electrode 21a. Then, as shown in FIG. 3C, the source electrode 24a and the drain electrode 24b are formed on the gate insulating layer 22 and contact the semiconductor layer 23, wherein the drain electrode 24b electrically connects (can also physically connect) the anode 21b. As shown in FIG. 3D, the first protective layer 29 is formed to cover those aforementioned switch elements (referred to as a switching assembly).

Figure 3E:
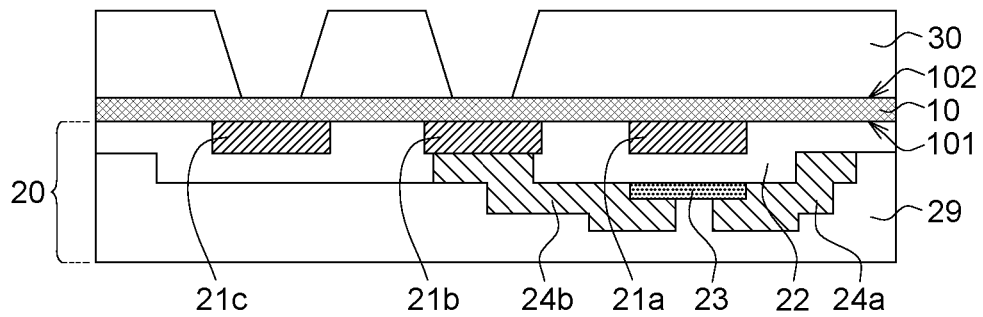
Figure 3F:
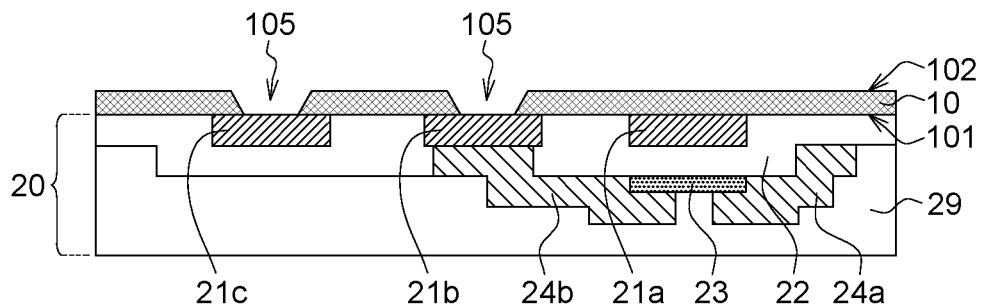
Figure 3G:
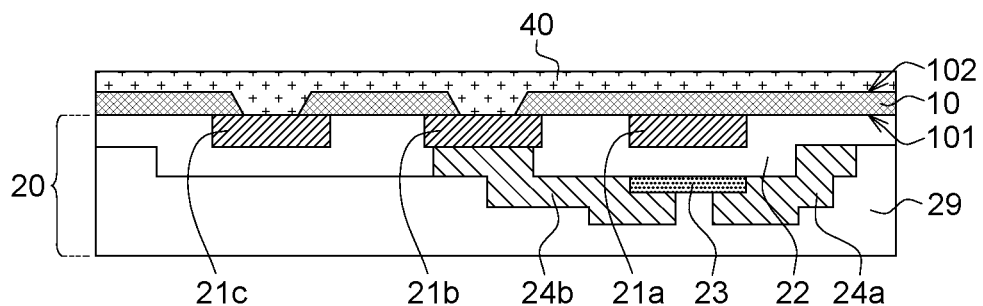
Figure 3H:
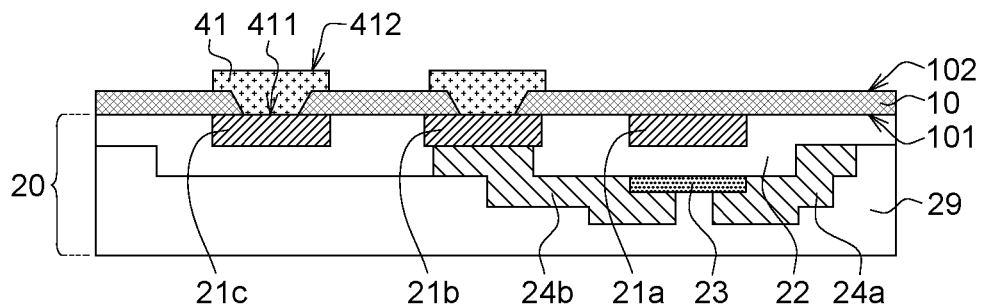

Afterwards, as shown in FIG. 3E, the substrate 10 is turned upside down, and a patterned photo-resist (PR) 30 is formed on the second surface 102 of the substrate 10. As shown in FIG. 3F, the substrate 10 is etched according to the patterned PR 30 to form several penetration holes 105, and the penetration holes 105 penetrate the substrate 10 from the second surface 102 to the first surface 101 to expose the anode 21b and the cathode 21c of each of the switch devices 20. Then, as shown in FIG. 3G, a bonding material layer 40 is formed on the second surface 102 of the substrate 10. The excess portion of the bonding material layer 40 is removed, so as to form the bonding material 41 filling up the penetration holes 105 as shown in FIG. 3H, wherein the top surface 411 of the bonding material 41 directly contacts the anode 21b and the cathode 21c of the switch devices 20. Additionally, in the first embodiment, the bottom surface 412 of the bonding material 41 can be slightly protruded from the second surface 102 of the substrate 10, or substantially at the same horizontal level of the second surface 102. Next, as shown in FIG. 3I, several displaying units 50 such as micro-LEDs are taken up by a pick-up equipment (PUE) and disposed on the substrate 10, wherein the N-type bump 56 and the P-type bump 57 of each displaying unit 50 contact the bottom surface 412 of the bonding material 41. Then, a second protective layer 59 is formed to cover the aforementioned displaying elements (ex: referred as a displaying assembly) of the displaying units, as shown in FIG. 3J (identical to FIG. 2).

In FIG. 3J, the first protective layer 29 for covering the switch elements (i.e. can be referred as a switching assembly) of each switch device 20 has a first protective surface 291, and the second protective layer 59 for covering the displaying elements (i.e. can be referred as a displaying assembly) of each displaying unit 50 has a second protective surface 591. In one embodiment, the first protective surface 291 is substantially parallel to the second protective surface 591, and for example, both of the first protective surface 291 and the second protective surface 591 are parallel to the first surface 101 and the second surface 102 of the substrate 10. Also, the first protective layer 29 and the second protective layer 59 can be made by the same material or different materials, depending on the product requirements of practical applications. Examples of applicable materials for forming the first and second protective layers include (but not limited to) polymethyl methacrylate (PMMA; also referred as acrylic), the inorganic insulating materials such as silicon oxide (SiOx), silicon nitride (SiNx), aluminum oxide (AlOx), or other suitable materials.

In the embodiment, the substrate 10 has a certain bearing capacity (ex: the material of the substrate 10 has a certain rigidity) and flatness, thereby increasing the yield of bonding between the displaying units 50 and the switch devices 20 when they are disposed on the flat substrate 10. According to the embodiment, applicable material examples of the substrate 10 include glass, polymeric materials (such as polyethylene (PE)), a semiconductor substrate (ex: silicon substrate) wrapped with an insulating material, a metal wrapped with an insulating material, and other suitable materials. The bonding material 41 can be formed by spot welding using an Au/Sn alloy or other suitable conductive materials to form the solder balls or the solder plates; alternatively, the bonding material 41 can be formed by electrode plating a suitable metal (ex: copper). The disclosure has no limitation thereto. Additionally, considering the stability and reliability of the product after assembly, the coefficients of thermal expansion (CTEs) of the materials for forming the gate electrode 21a, the anode 21b, the cathode 21c, the bonding material 41, the N-type bump 56 and the P-type bump 57 can be close.

Second Embodiment

FIG. 4 is a cross-sectional view of three adjacent pixel regions of a display apparatus according to the second embodiment of the present disclosure. FIG. 5A-FIG. 5G show a method of manufacturing the display apparatus of the second embodiment. Similar to the first embodiment, the TFTs and the micro-LEDs are exemplified for illustrating the switch devices 20 and the displaying units 50 of the second embodiment. As shown in FIG. 4, the switch devices 20 and the displaying units 50 of the second embodiment are disposed at different sides of the substrate 10, and the displaying units 50 and the switch devices 20 are electrically connected by the bonding material 41 filling in the penetration holes 105. In the embodiment, the bonding material 41 is a conductive material, and the displaying units 50 are electrically connected to the switch devices 20 by the bonding material 41.

The identical and/or similar elements of the second embodiment (FIG. 4 and FIG. 5A-FIG. 5G) and the first embodiment (FIG. 2 and FIG. 3A-FIG. 3J) are designated with the same and/or similar reference numerals for clear illustration. Please refer to the related contents in the first embodiment for the structures and positions of the switch devices 20 and the displaying units 50 in the second embodiment, and the details are not redundantly repeated hereinafter.

In the second embodiment, the displaying units 50 are disposed before setting the switch devices 20, which is different from the disposing steps of the first embodiment. As shown in FIG. 5A, several displaying units 50 such as micro-LEDs are taken up by the pick-up equipment (PUE) and disposed on the substrate 10, wherein the N-type bump 56 and the P-type bump 57 of each displaying unit 50 contact the first surface 101 of the substrate 10. Then, as shown in FIG. 5B, the substrate 10 is turned upside down, and a patterned PR 30 is formed on the second surface 102 of the substrate 10. As shown in FIG. 5C, the substrate 10 is etched according to the patterned PR 30 to form several penetration holes 105, and the penetration holes 105 penetrate the substrate 10 from the second surface 102 to the first surface 101 to expose the electrode layers such as the N-type bump 56 and the P-type bump 57 of each displaying unit 50. Then, as shown in FIG. 5D, a bonding material 41 is formed to fill up the penetration holes 105, wherein the top surface 411 of the bonding material 41 contacts N-type bumps 56 and the P-type bumps 57 of the displaying units 50. In the second embodiment, the bonding material 41 with conductivity can be adopted to form the gate electrode 21a in the same manufacturing step, as shown in FIG. 5D, wherein the surface of the gate electrode 21a and the bottom surface 412 of the bonding material 41 are positioned substantially at the same horizontal level (ex: the surface of the gate electrode 21a aligned with the bottom surface 412 of the bonding material 41). Therefore, the bonding material 41 with conductivity can be configured to serve as the electrodes (such as the anodes and the cathodes) of the switch devices 20. Afterwards, steps of manufacturing other elements are completed, such as forming the gate insulating layer 22 to cover the gate electrode 21a and the bonding material 41 (FIG. 5E); forming the semiconductor layer 23 on the gate insulating layer 22; forming the source electrode 24a and the drain electrode 24b on the gate insulating layer 22 to contact the semiconductor layer 23 (FIG. 5F; the drain electrode 24b electrically connects the bottom surface 412 of the bonding material 41); and forming the first protective layer 29 to cover those aforementioned switch elements (referred to as a switching assembly) (FIG. 5G).

Third Embodiment

FIG. 6 is a cross-sectional view of three adjacent pixel regions of a display apparatus according to the third embodiment of the present disclosure. FIG. 7A-FIG. 7M show a method of manufacturing the display apparatus of the third embodiment. Similar to the first embodiment, the TFTs and the micro-LEDs are exemplified for illustrating the switch devices 20 and the displaying units 50 of the third embodiment. Unlike a single substrate 10 used in the first and second embodiments, two substrates (i.e. the first substrate 10A and the second substrate 10B) are adopted in the third embodiment for separately forming the switch devices 20 and the displaying units 50, followed by assembling the two substrates. As shown in FIG. 6, when the first substrate 10A and the second substrate 10B are treated as a substrate, the switch devices 20 and the displaying units 50 of the third embodiment are disposed at different sides of the substrate as a whole. Additionally, the displaying units 50 and the switch devices 20 of the third embodiment are still positioned at different sides of the first substrate 10A. The displaying units 50 and the switch devices 20 are also positioned at different sides of the second substrate 10B.

The identical and/or similar elements of the third embodiment (FIG. 6 and FIG. 7A-FIG. 7M) and the first embodiment (FIG. 2 and FIG. 3A-FIG. 3J) are designated with the same and/or similar reference numerals for clear illustration. Please refer to the related contents in the first and second embodiments for the structures and manufacturing steps of the switch devices 20 and the displaying units 50 in the third embodiment, and the details are not redundantly repeated hereinafter.

For example, as shown in FIG. 7A-FIG. 7H of the thirst embodiment, the structures and the manufacturing steps of the switch devices 20 (FIG. 7A-FIG. 7D), the structures and the manufacturing steps for forming the first penetration holes 105A in the first substrate 10A (FIG. 7E-FIG. 7F) and filling the first bonding material 41A in the first penetration holes 105A (FIG. 7G-FIG. 7H) are the same as that of the first embodiment shown in FIG. 3A-FIG. 3H.

Figure 7A:
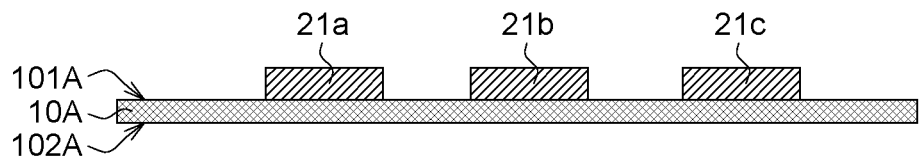
Figure 7B:
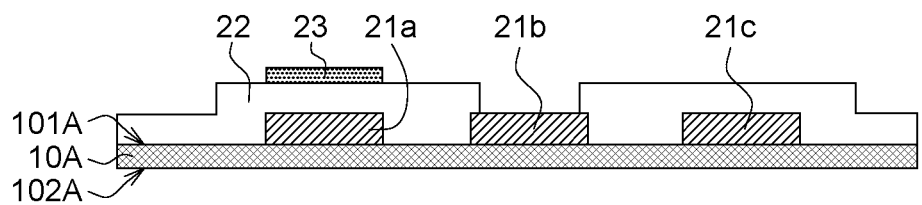
Figure 7C:
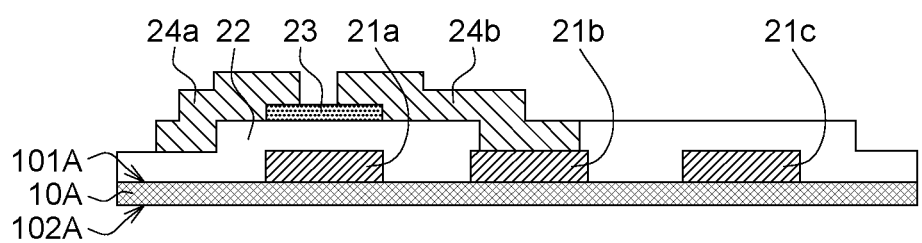
Figure 7D:
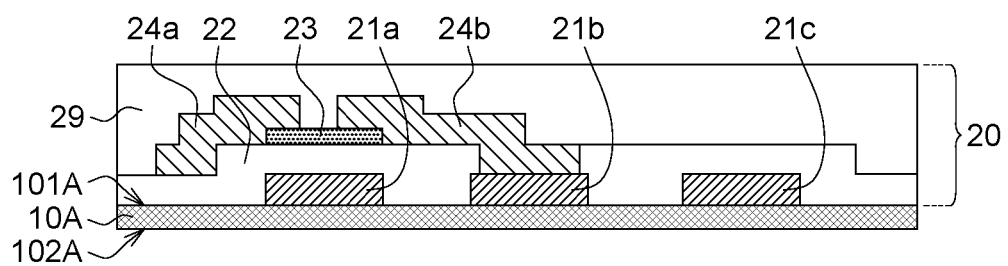
Figure 7E:
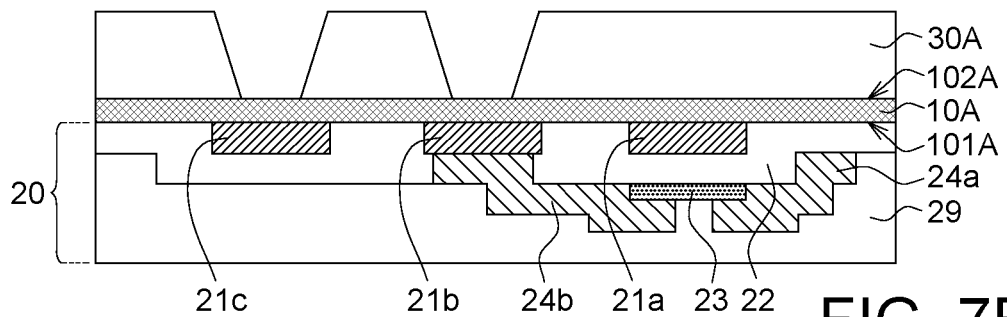
Figure 7F:
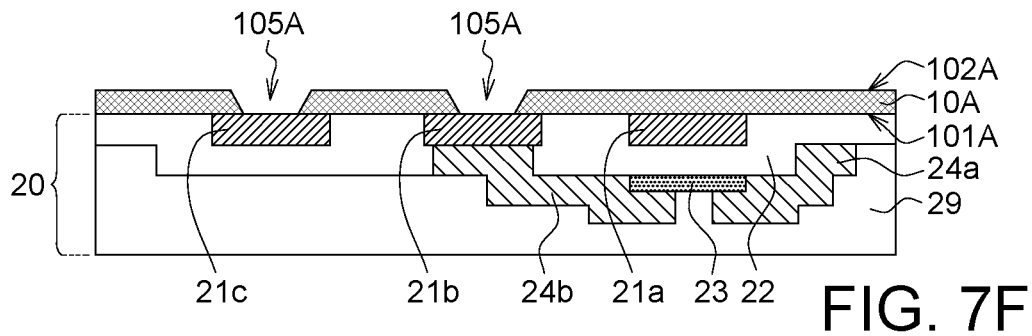
Figure 7G:
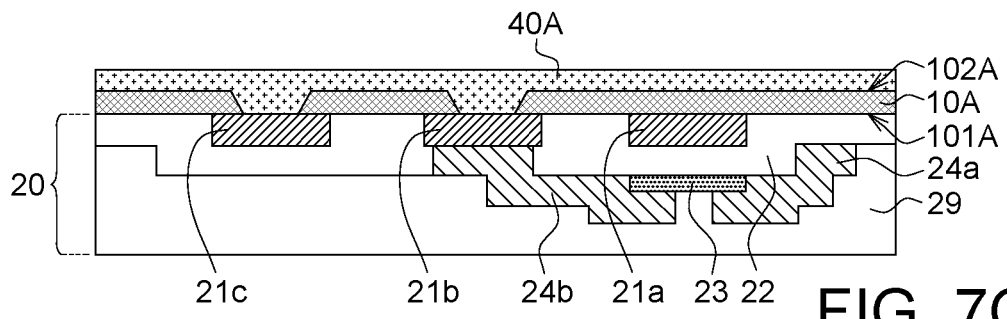
Figure 7H:
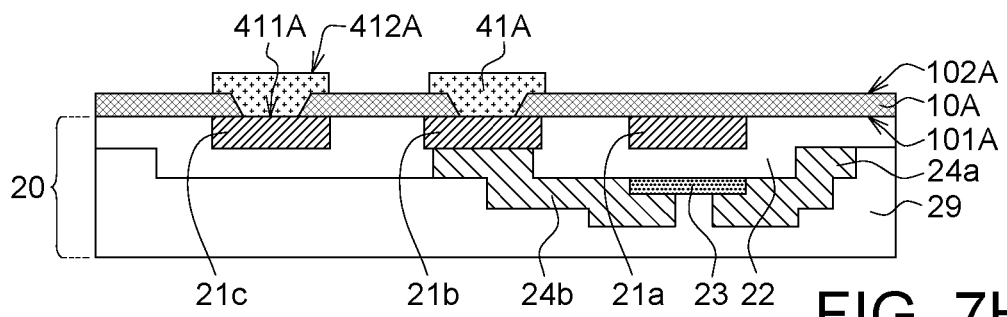
Figure 7L:
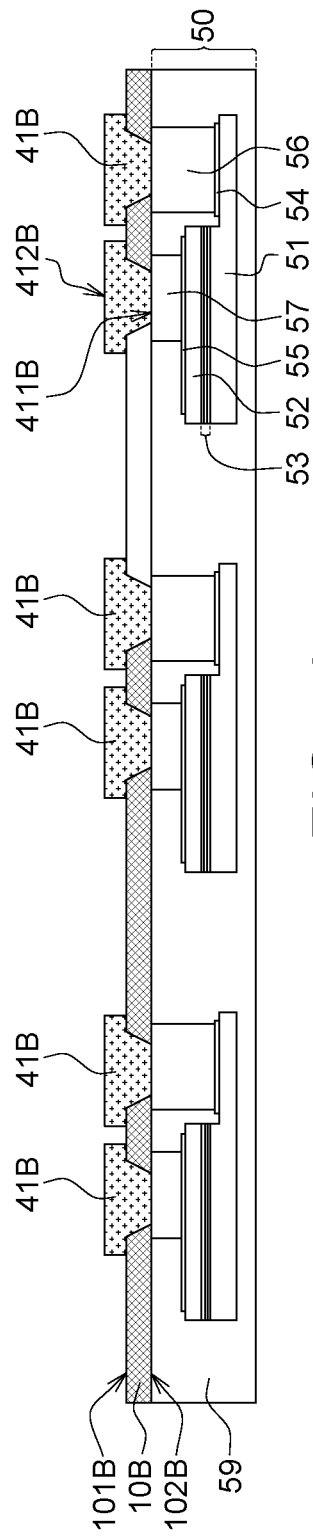

For example, as shown in FIG. 7I-FIG. 7L of the thirst embodiment, the structures and the manufacturing steps of the displaying units 50 (FIG. 7I), the structures and the manufacturing steps for forming the second penetration holes 105B in the second substrate 10B (FIG. 7J-FIG. 7K) and filling the second bonding material 41B in the second penetration holes 105B (FIG. 7L) are the same as that of the second embodiment shown in FIG. 5A-FIG. 5D (except that the second bonding material 41B of FIG. 7L does not function as the electrodes of the switch devices 20 as the bonding material 41 of FIG. 5D does).

Figure 7M:
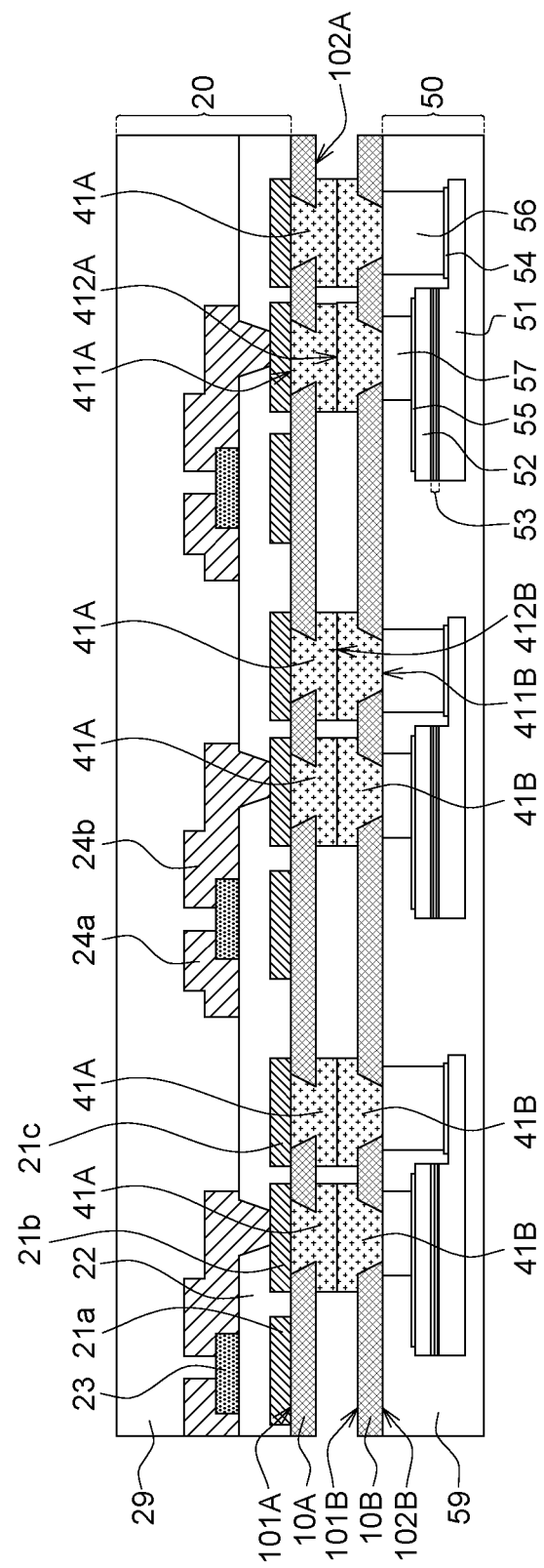

Finally, as shown in FIG. 7M, the first substrate 10A with the switch devices 20 and the first bonding material 41A is assembled to the second substrate 10B with the displaying units 50 and the second bonding material 41B to produce a display apparatus of the third embodiment. As shown in FIG. 6 and FIG. 7M, the switch devices 20 are positioned at the upper side of the first substrate 10A (i.e. on the first surface 101A), and the displaying units 50 are positioned at the lower side of the second substrate 10B (i.e. on the second surface 102B), wherein the lower side (i.e. the second surface 102A) of the first substrate 10A is assembled to the upper side (i.e. the first surface 101B) of the second substrate 10B.

The first bonding material 41A and the second bonding material 41B can be made by the same material or different materials, and the disclosure has no limitation thereto. In some embodiments, the coefficients of thermal expansion (CTEs) of the materials for forming the first bonding material 41A and the second bonding material 41B can be close for improving the stability and reliability of the product after assembly. In one embodiment, the first bonding material 41A and the second bonding material 41B can be formed by spot welding using an Au/Sn alloy or other suitable conductive materials to form the solder balls or the solder plates, followed by thermal compression to join the solder balls/solder plates. Alternatively, the first bonding material 41A and the second bonding material 41B can be formed by electrode plating the suitable metals (ex: copper/copper), followed by melt compression (pressing and melting) to accomplish the assembly.

Figure 8A:
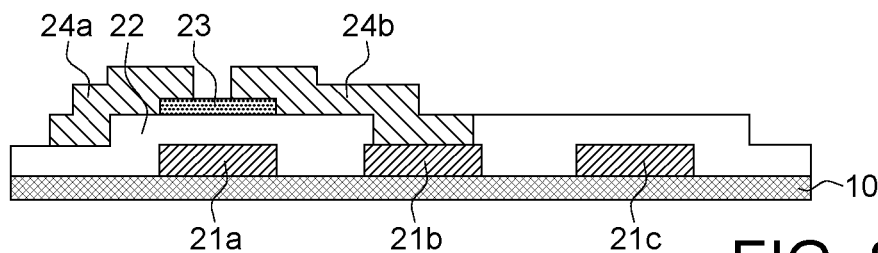
FIG. 8A illustrates a BCE-type TFT formed on the substrate.
Figure 8B:
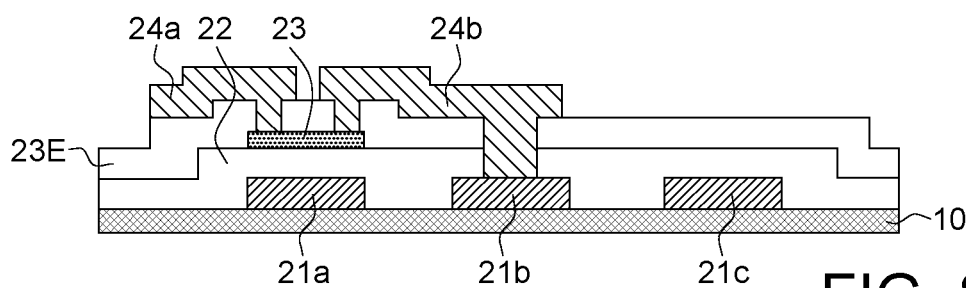
FIG. 8B illustrates an etch-stop type TFT formed on the substrate.
Figure 8C:
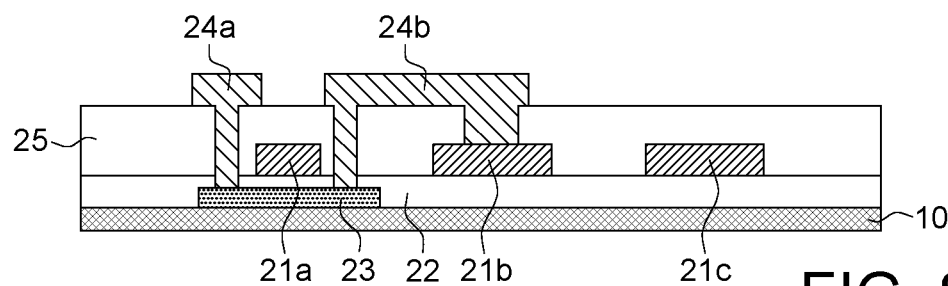
FIG. 8C illustrates a top-gate type TFT formed on the substrate.

Although the BCE-type TFTs are exemplified as the switch devices of the embodiments, the disclosure is not limited thereto, and other types of switch devices can be applied in the disclosure. FIG. 8A illustrates a BCE-type TFT formed on the substrate 10. FIG. 8B illustrates an etch-stop type TFT formed on the substrate 10, wherein an etching stop layer 23E positioned between the gate insulating layer 22 and the source electrode 24a/the drain electrode 24b covers parts of the semiconductor layer 23. FIG. 8C illustrates a top-gate type TFT formed on the substrate 10, wherein the semiconductor layer 23 is formed on the substrate 10, and the gate insulating layer 22 covers the semiconductor layer 23; the gate electrode 21a (above the semiconductor layer 23), the anode 21b and the cathode 21c are formed on the gate insulating layer 22 and covered by another insulating layer 25; also, the source electrode 24a and the drain electrode 24b are formed on the insulating layer 25 and electrically connected to the semiconductor layer 23 and the anode 21b. The identical and/or similar elements of FIG. 8A-FIG. 8C and the aforementioned embodiments are designated with the same and/or similar reference numerals, and the details are not redundantly repeated. Different types of the switch devices such as the TFTs shown in FIG. 8A-FIG. 8C can be applied in the disclosure, and the configurations of the display apparatus can be modified or changed depending on the practical application. For example, if the switch device as shown in FIG. 8C is applied in the disclosure, the penetration holes in the substrate can extend and penetrate the gate insulating layer 22 for exposing the bottom surfaces of the anode 21b and the cathode 21c, so that the bonding material filled in the penetration holes can contact the anode 21b and the cathode 21c. Material examples of the semiconductor layer 23 include (but not limited to) metal oxide semiconductors, amorphous silicon and low-temperature polysilicon.

Moreover, although the micro-LEDs are exemplified as the displaying units of the embodiments, the disclosure is not limited thereto, and other types of the displaying units, such as the organic light emitting diodes (OLEDs), can be applied in the disclosure.

Fourth Embodiment

Figure 9:
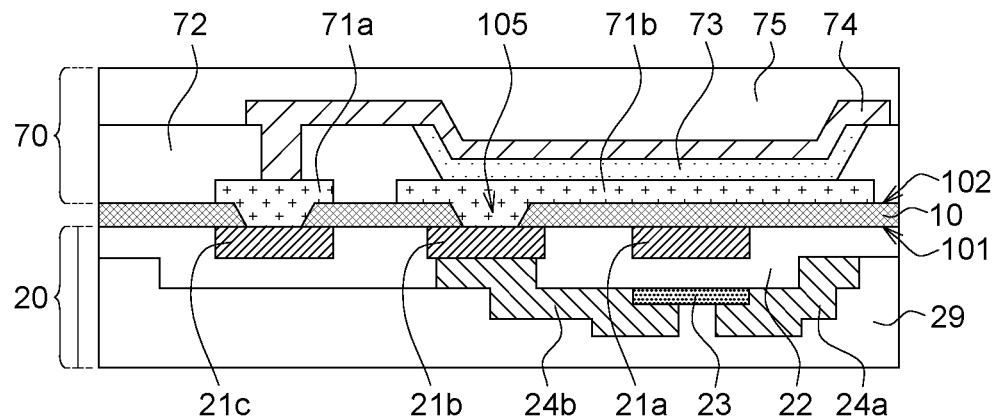
FIG. 9 is a cross-sectional view of three adjacent pixel regions of a display apparatus according to the fourth embodiment of the present disclosure.

FIG. 9 is a cross-sectional view of three adjacent pixel regions of a display apparatus according to the fourth embodiment of the present disclosure. FIG. 10A-FIG. 10H show a method of manufacturing the display apparatus of the fourth embodiment, wherein the OLEDs are exemplified as the displaying units of this embodiment.

The identical and/or similar elements of the fourth embodiment (FIG. 9 and FIG. 10A-FIG. 10H) and the first embodiment (FIG. 3A-FIG. 3J and FIG. 2) are designated with the same and/or similar reference numerals for clear illustration. Please refer to the related contents in the first embodiment for the structures and positions of the switch devices 20 and the displaying units 50 in the fourth embodiment, and the details are not redundantly repeated hereinafter. For example, in the manufacturing processes of FIG. 10A-FIG. 10 F, the formations of the switch devices 20 as shown in FIG. 10A-FIG. 10D, formations of the penetration holes 105 in the substrate 10, and positions of the penetration holes 105 corresponding to the switch electrodes (FIG. 10E-FIG. 10F) are the same as the processes of FIG. 3A-FIG. 3F as described in the first embodiment.

Figure 10A:
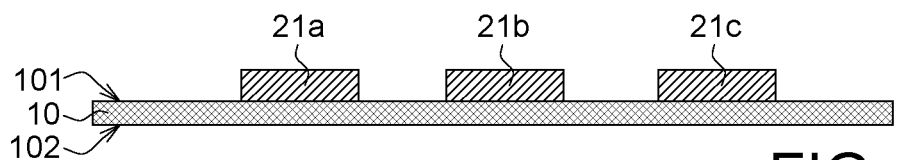
FIG. 10A-FIG. 10H show a method of manufacturing the display apparatus of the fourth embodiment.
Figure 10B:
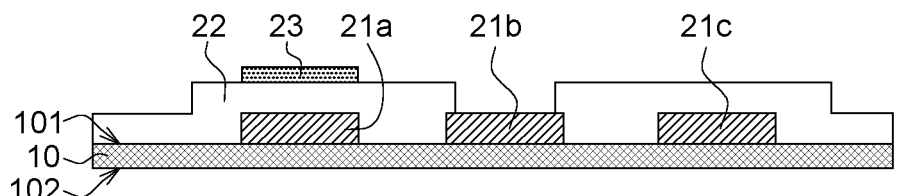
Figure 10C:
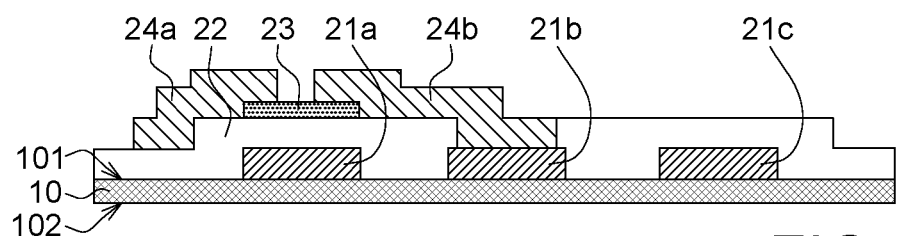
Figure 10D:
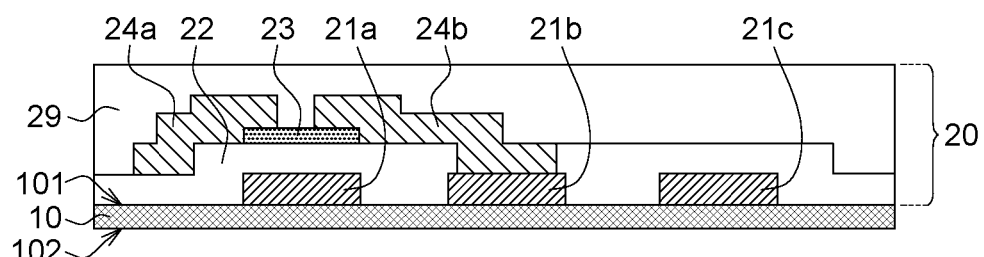
Figure 10E:
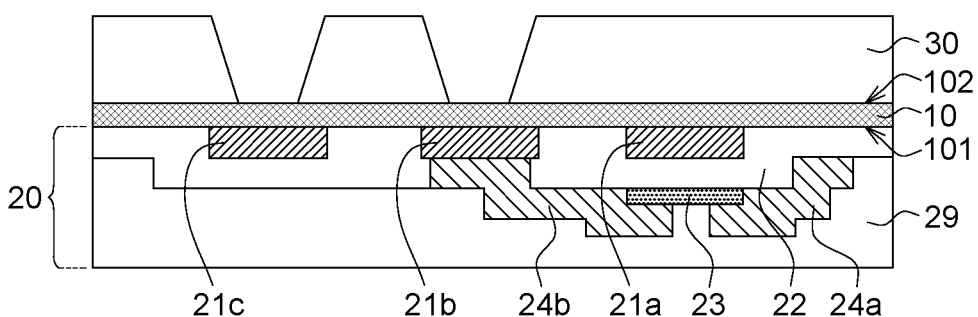
Figure 10F:
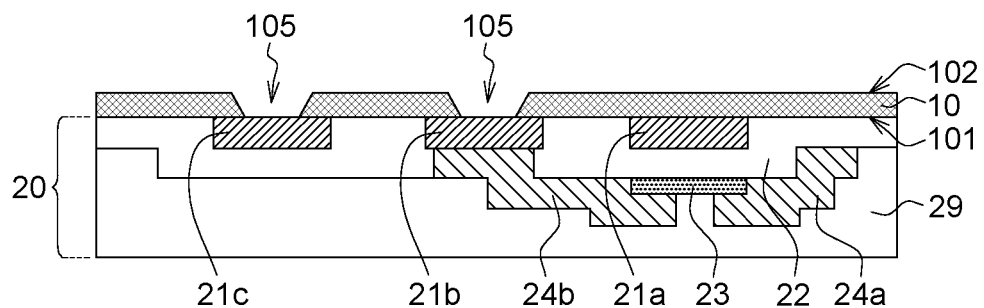
Figure 10G:
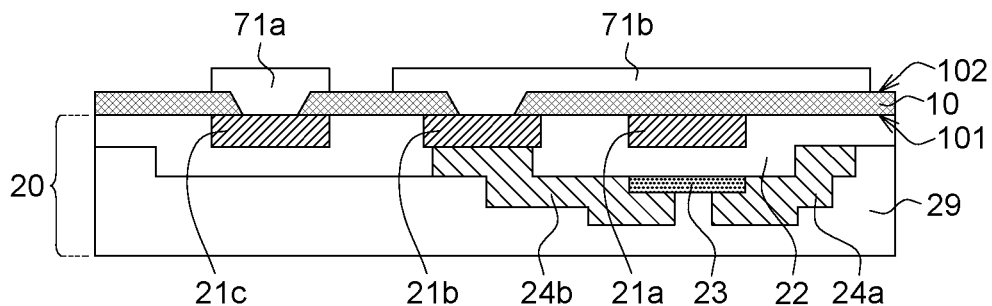
Figure 10H:
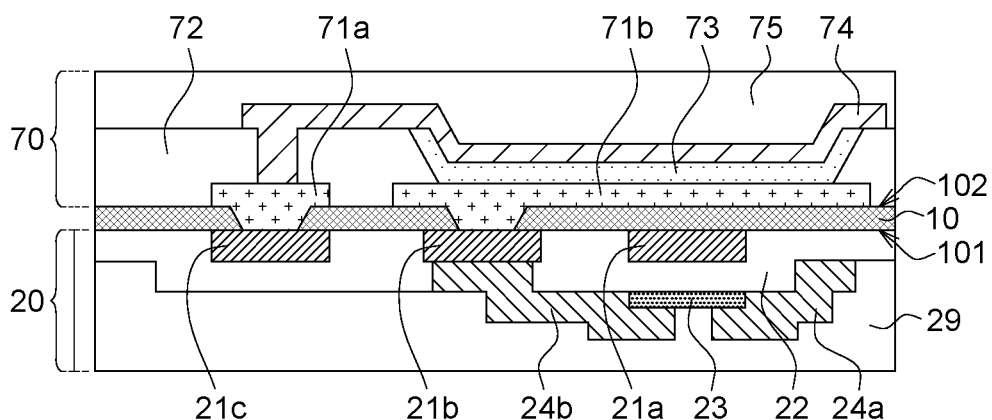

Then, as shown in FIG. 10G, a bonding material is filled in the penetration holes 105 (i.e. a conductive material), followed by patterning the bonding material to form the first electrode portion 71a (connected to the cathode 21c) and a second electrode portion 71b (connected to the anode 21b), Afterwards, as shown in FIG. 10H, the related layers of the OLED including a pixel defining layer 72, an organic light emitting layer 73, and an electrode layer 74 (connected to the first electrode portion 71a) are formed, which are referred as a displaying assembly. Then, a second protective layer 75 covering those above-mentioned displaying assembly is fabricated for accomplishing the displaying units 70 of the fourth embodiments.

According to the aforementioned descriptions, the display apparatus according to the embodiments is provided by disposing the displaying units and the switch devices at different sides of the substrate, and the connection between the displaying units and the switch devices is achieved by the bonding material filling in the penetration holes of the substrate. In some embodiments, the bonding material is a conductive material, wherein the displaying units and the switch devices disposed respectively at different sides of the substrate are electrically connected to each other through the bonding material in the penetration holes. According to the design of the embodiments, the accurate patterns of the displaying units and the switch devices can be implemented and the good electrical performance (including good electrical connection) of the display apparatus can be achieved, thereby producing the display apparatus with good reliability and good displaying quality. In addition, since the displaying units and the switch devices are disposed on different sides of the substrate, if defect or damage is found in the displaying unit or the switch device during product inspection, only the display unit or only the switch device can be removed independently without affecting the other one. Additionally, according to the display apparatus design of the embodiments, since the displaying units are directly disposed on the flat substrate, the production yield can be increased.

Figure 11A:
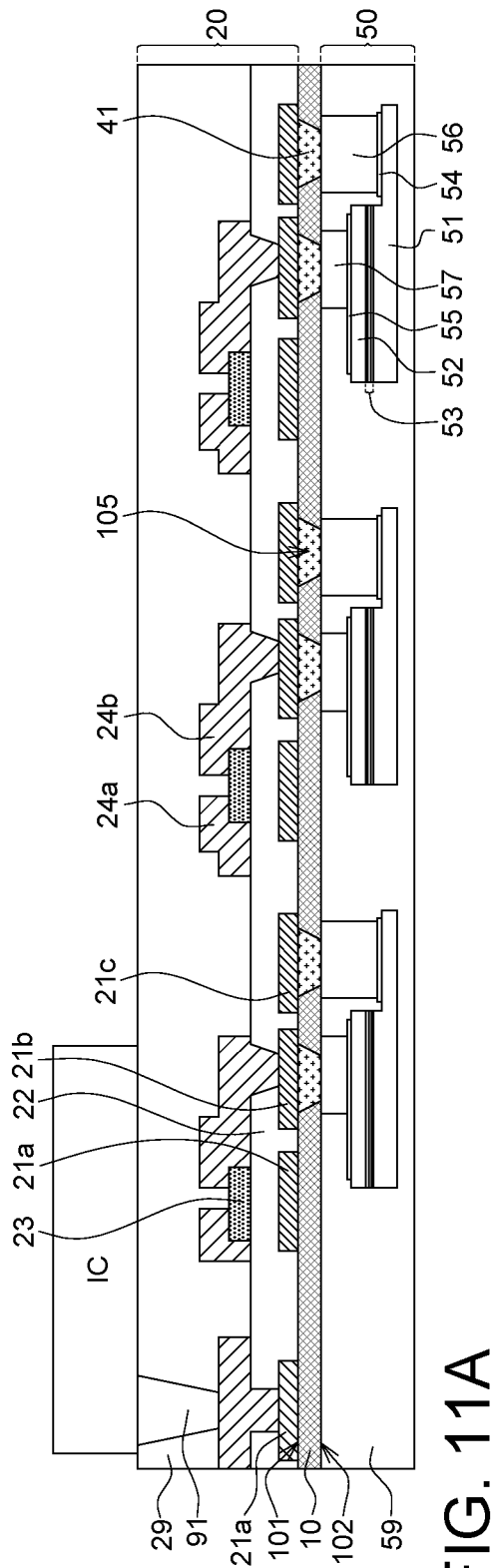
FIG. 11A and FIG. 11B illustrate the embodied display apparatus connected to an integrated circuit and a printed circuit board assembly according to the practical applications, respectively.
Figure 11B:
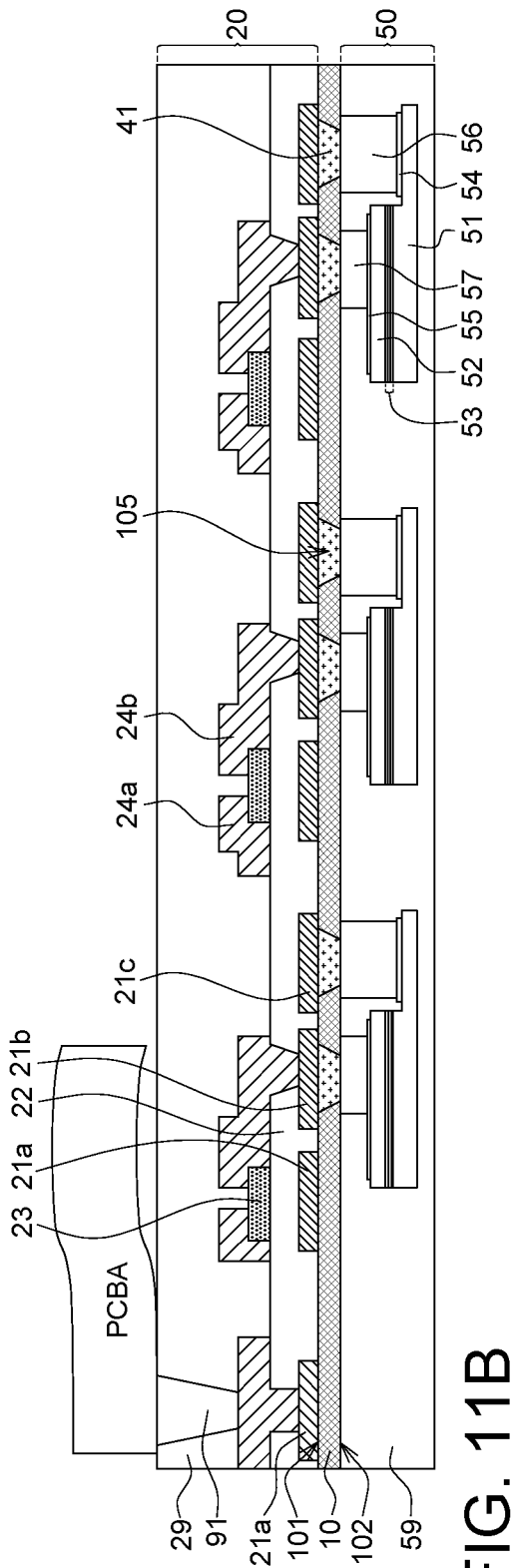

Moreover, in the practical applications, the data lines, the scan lines (FIG. 1) and the switch devices such as TFTs in the pixel regions of the display apparatus of the embodiment can be disposed at the same side of the substrate (ex: at the backside of the substrate), while the displaying units are disposed at the other side of the substrate (ex: at the front side of the substrate). Please refer to FIG. 11A and FIG. 11B, which illustrate the embodied display apparatus connected to an integrated circuit and a printed circuit board assembly according to the practical applications, respectively. In FIG. 11A and FIG. 11B, the display apparatus of the first embodiment is adopted for exemplification, wherein the switch devices 20 and an integrated circuit (IC, as shown in FIG. 11A) or a printed circuit board assembly (PCBA, as shown in FIG. 11B) are disposed at the same side of the substrate (ex: the IC or the PCBA is electrically connected to the corresponding electrode through the conductive plug 91). It is noted that other types of the display apparatus with different configurations are applicable in the disclosure. According to the embodied design, the TFTs and the conductive traces (such as the IC, the PCBA or other conductive lines originally disposed at the border region) can be disposed at the same side of the substrate and hidden in the backside of the substrate; therefore, the overall space for disposing the layers/components of the display apparatus can be reduced. The area of the border region of the display apparatus for setting the conductive traces originally can be reduced for space saving. Thus, according to the display apparatus design of the embodiments, the space can be efficiently used, and the display apparatus can obtain maximum display effect while using a limited space.

Structural details of the aforementioned embodiments are provided for exemplification only, not for limitation. Other embodiments with different configurations, such as change on components of the switch devices and the displaying units and change on positions of the electrode structures and the penetration holes to meet practical requirements can be applicable. Also, the material selection and jointing methods of the bonding material can be determined according to the actual needs of the practical applications. It is, of course, noted that the configurations of figures are depicted only for demonstration, not for limitation. It is known by people skilled in the art that the configurations and the procedure details of the related components/layers could be adjusted according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method of a display apparatus, comprising:
    providing a first substrate;
    forming at least one switch device on the first substrate;
    providing a second substrate;
    forming at least one displaying unit on a surface of the second substrate;
    patterning the second substrate to form a plurality of penetrating holes;
    forming a conductive material in the penetrating holes of the second substrate; and
    assembling the first substrate to the second substrate, wherein the at least one displaying unit is electrically connected to the at least one switch device through the conductive material formed in the penetrating holes of the second substrate;
    wherein the manufacturing method of the display apparatus further comprising:
        forming a patterned conductive layer on a first surface of the first substrate to form a gate electrode, an anode and a cathode of the at least one switch device; and
        forming a gate insulating layer on the patterned conductive layer, wherein the gate insulating layer covers the gate electrode and the cathode, and the gate insulating layer exposes a surface of the anode.

2. The manufacturing method of the display apparatus according to claim 1, further comprising:
    forming a semiconductor layer on the gate insulating layer, wherein the semiconductor layer is disposed correspondingly to the gate electrode.

3. The manufacturing method of the display apparatus according to claim 1, further comprising:
    forming a source electrode and a drain electrode on the gate insulating layer, wherein the drain electrode connects the anode.

4. The manufacturing method of the display apparatus according to claim 1, further comprising:
    forming a patterned photo-resist on a second surface of the first substrate.

5. The manufacturing method of the display apparatus according to claim 4, wherein the first substrate is etched according to the patterned photo-resist to form a plurality of penetrating holes.

6. The manufacturing method of the display apparatus according to claim 5, wherein the penetrating holes of the first substrate penetrate the first substrate from the second surface to the first surface to expose the anode and the cathode of the at least one switch device.

7. The manufacturing method of the display apparatus according to claim 6, further comprising:
    forming a conductive material layer on the second surface of the first substrate.

8. The manufacturing method of the display apparatus according to claim 7, further comprising:
    removing an excess portion of the conductive material layer to form a conductive material of the first substrate.

9. The manufacturing method of the display apparatus according to claim 8, wherein a top surface of the conductive material of the first substrate directly contacts the anode and the cathode of the at least one switch device.

10. The manufacturing method of the display apparatus according to claim 1, wherein the first substrate is assembled to another surface of the second substrate which is opposite to the surface of the second substrate.

11. The manufacturing method of the display apparatus according to claim 1, further comprising:
    forming a patterned photo-resist on another surface of the second substrate.

12. The manufacturing method of the display apparatus according to claim 11, wherein the second substrate is etched according to the patterned photo-resist to form the penetrating holes.

13. The manufacturing method of the display apparatus according to claim 12, wherein the penetrating holes penetrate the second substrate from the another surface to the surface.

14. The manufacturing method of the display apparatus according to claim 11, further comprising:
    turning the second substrate upside down, wherein the another surface of the second substrate faces up.

15. The manufacturing method of the display apparatus according to claim 1, wherein the conductive material is formed by spot welding using an Au/Sn alloy.

16. The manufacturing method of the display apparatus according to claim 1, wherein the conductive material is formed by electrode plating copper/copper.

17. The manufacturing method of the display apparatus according to claim 1, wherein an N-type bump and a P-type bump of the at least one displaying unit contact the surface of the second substrate.

18. The manufacturing method of the display apparatus according to claim 17, wherein a top surface of the conductive material formed in the penetrating holes of the second substrate contacts the N-type bump and the P-type bump of the at least one displaying unit.

* * * * *